United States Patent [19]

Morii et al.

[11] 4,021,761
[45] May 3, 1977

[54] FILTER CIRCUIT HAVING AN ACOUSTIC SURFACE-WAVE FILTER DEVICE

[75] Inventors: Kokichi Morii, Chigasaki; Ken-Ichi Urayama, Kamakura, both of Japan

[73] Assignee: Sony Corporation, Tokyo, Japan

[22] Filed: Jan. 26, 1976

[21] Appl. No.: 652,615

[30] Foreign Application Priority Data

Jan. 30, 1975 Japan .............................. 50-12738

[52] U.S. Cl. ................................ 333/72; 310/8.2; 310/9.8; 330/174
[51] Int. Cl.² .................... H03H 9/04; H03H 9/26; H03H 9/32; H03F 13/00
[58] Field of Search ........... 333/30 R, 72, 71, 70 R, 333/28 R; 310/8.1, 8.2, 9.7, 9.8; 330/174

[56] References Cited

UNITED STATES PATENTS

| | | | |
|---|---|---|---|
| 2,400,857 | 5/1946 | Turner | 333/70 R X |
| 3,446,974 | 5/1969 | Seiwatz | 333/72 X |
| 3,621,482 | 11/1971 | Adler | 333/72 |
| 3,745,564 | 7/1973 | Gandolfo et al. | 310/8.1 X |
| 3,831,116 | 8/1974 | Davis, Jr. et al. | 333/72 |
| 3,942,135 | 3/1976 | Moor et al. | 333/30 R X |

OTHER PUBLICATIONS

White et al.—"Direct Piezoelectric Coupling to Surface Elastic Waves" in Applied Physic Letters, 15 Dec. 1965; pp. 314–316.

*Primary Examiner*—Alfred E. Smith
*Assistant Examiner*—Marvin Nussbaum
*Attorney, Agent, or Firm*—Lewis H. Eslinger; Alvin Sinderbrand

[57] ABSTRACT

A filter circuit includes an acoustic surface-wave filter device having an input transducer comprised of a set of interleaved electrodes disposed on a first portion of a body of piezo-electric material adapted to propagate acoustic surface waves for producing an acoustic surface-wave signal in response to an input signal applied to the input transducer, and an output transducer comprised of a set of similar interleaved electrodes disposed on a second portion of the piezo-electric body spaced a selected distance from the first portion for receiving the acoustic surface-wave signals so as to produce a corresponding output signal having a selected frequency response. The frequency response (e.g., bandwidth) of the acoustic surface-wave filter device is controlled by selectively changing the number of conductor elements constituting the interleaved electrodes of the input and output transducers. An amplifier drives the acoustic surface-wave filter device, the gain and output impedance of the amplifier being changed as the frequency response of the acoustic surface-wave filter device changes, so as to compensate for corresponding changes in the insertion loss and input impedance of the filter device.

18 Claims, 5 Drawing Figures

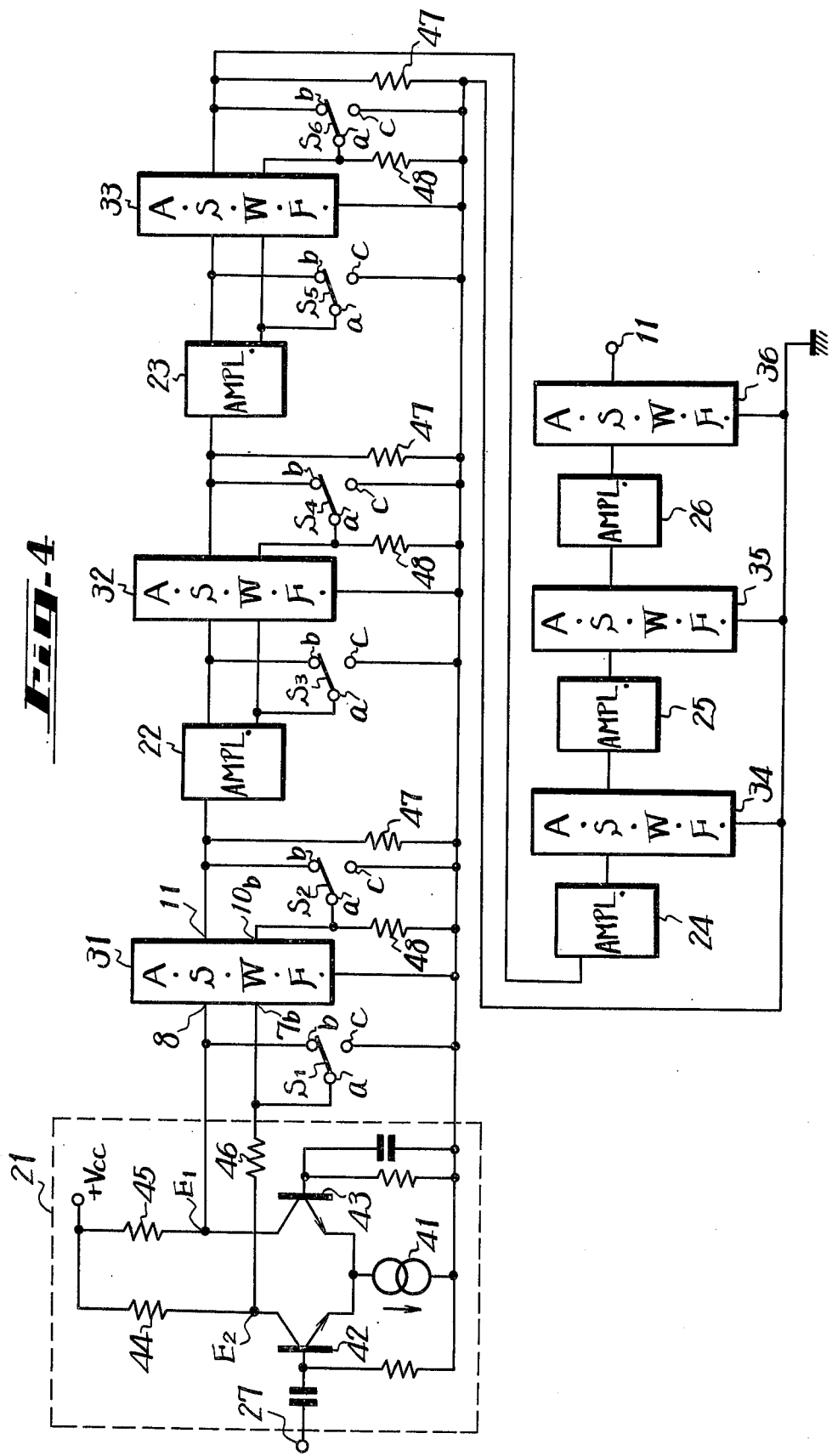

4,021,761

FILTER CIRCUIT HAVING AN ACOUSTIC SURFACE-WAVE FILTER DEVICE

BACKGROUND OF THE INVENTION

1. Field of the Invention

The present invention relates generally to filter circuits having controllable frequency responses and, more particularly, to a filter circuit including an acoustic surface-wave filter device whose bandwidth can be controlled.

2. Description of the Prior Art

The capability of changing the bandwidth of a filter circuit finds many divers and useful applications. For example, in the field of radio broadcast reception, it is desirable to change the bandwidth of the IF (intermediate frequency) stage of an FM receiver to a relatively narrow band or to a relatively wide band depending upon the intensity of the received electric fields. This is because when an electric field is weak, the bandwidth is made narrow to enhance the signal-to-noise (S/N) ratio, sensitivity and selectivity; while when the electric field is strong, e.g., higher than a predetermined value, the bandwidth is made wide to enhance the distortion and stereo-separation characteristics.

There are, of course, various filter circuits which can be and have been used in the IF stage. It has been suggested that an acoustic surface-wave filter device may also be used. In general, an acoustic surface-wave filter device is comprised of input and output transducers formed on a body of piezo-electric material, each of the input and output transducers being made of a pair of interleaved electrodes and being separated by a predetermined distance so as to provide a predetermined delay characteristic or filter characteristic by propagating an acoustic surface-wave between the input and output transducers. The acoustic surface-wave filter offers superior group delay characteristics. Consequently, if used in the IF stage, the phase characteristic becomes flat, and accordingly the FM stereo-separation and distortion characteristics are improved. For these reasons, the acoustic surface-wave filter is most suitable for use in an FM receiver.

In order to change the bandwidth of such a filter, for example, to wide or narrow band characteristics, the number of conductive elements constituting the interleaved electrodes must be changed. However, when the number of conductive elements in the electrodes is changed, there is a resultant variation in the filter insertion loss and input and output impedances. Thus, the predictability of the band characteristics of the acoustic surface-wave filter device is difficult if these characteristics are to be changeable.

OBJECTS OF THE INVENTION

Accordingly, it is an object of the present invention to provide an improved filter including an acoustic surface-wave filter device which is free from the drawbacks noted hereinabove.

It is another object of the invention to provide a filter including an acoustic surface-wave filter device driven by an amplifier in which the gain of the amplifier is changed as the bandwidth of the filter is changed.

It is a further object of the invention to provide a filter circuit including an acoustic surface-wave filter device driven by an amplifier in which the gain and output impedance of the amplifier are varied to compensate for the changes in insertion loss and input impedance of the filter when the bandwidth of the filter is changed.

Various other objects, advantages and features will become apparent from the ensuing detailed description, and the novel features will be particularly pointed out in the appended claims.

SUMMARY OF THE INVENTION

In accordance with an aspect of the present invention, a filter circuit is provided with an acoustic surface-wave filter device having an input transducer comprised of a pair of comb-type interleaved electrodes disposed on a first portion of a body made of piezo-electric material adapted to propagate acoustic surface-waves and an output transducer comprised of a pair of comb-type interleaved electrodes disposed on a second portion of the piezo-electric body spaced by a selected distance from the first portion, an amplifier drives the acoustic surface-wave filter device by supplying an amplified signal to the input transducer electrodes; and a control circuit is adapted to selectively change the bandwidth of the acoustic surface-wave filter device and to change the gain of the amplifier as the bandwidth of the acoustic surface-wave filter device changes.

BRIEF DESCRIPTION OF THE DRAWINGS

The following detailed description, given by way of example, will best be understood in conjunction with the accompanying drawings, in which:

FIG. 4 is a circuit diagram showing an embodiment of a filter circuit using acoustic surface-wave filter devices according to the present invention.

DETAILED DESCRIPTION OF A CERTAIN ONE OF THE PREFERRED EMBODIMENTS

Figure 1:
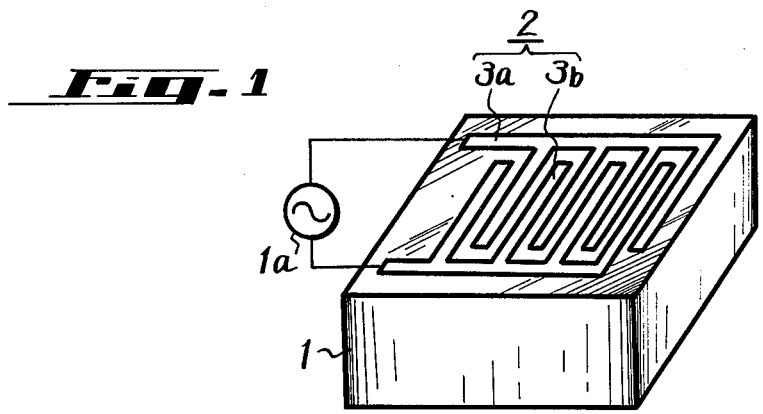
FIG. 1 is a perspective view of an embodiment of an acoustic surface-wave filter device which can be used with the present invention.

An acoustic surface-wave filter device which can be used with this invention is shown in FIG. 1. This device is comprised of a body 1 made of piezo-electric material on which interdigital electrodes 2 are mounted. The electrodes 2 are formed of separate, interleaved comb-type electrodes 3a and 3b, respectively, which may be considered to comprise a pair of such comb-type electrodes. An AC electric field is applied across the electrodes 3a and 3b from an AC source 1a to thereby originate an acoustic surface-wave. The electrodes 2 comprise an input transducer, and an output transducer (not shown) of similar construction (i.e., a pair of interleaved electrodes) is provided on the piezo-electric body spaced from the input transducer by a predetermined distance. In this arrangement, the insertion loss frequency characteristics resemble that of a band pass filter. Furthermore, the group delay characteristics of the acoustic surface-wave filter device becomes substantially constant and, hence, its phase characteristic becomes flat.

Figure 2A:
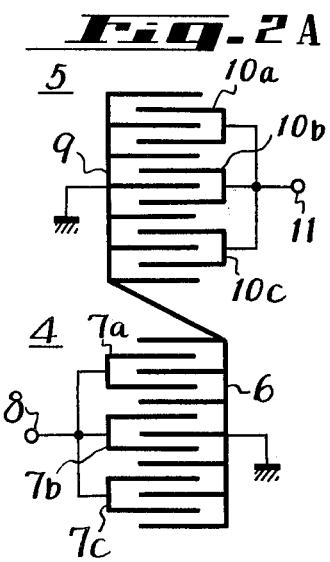
FIGS. 2A and 2B are plan views respectively showing how an acoustic surface-wave filter device can be used in the present invention.

FIG. 2A is a schematic representation of one example of the electrode structure pattern or configuration for this acoustic surface-wave filter device. The input transducer 4 and output transducer 5 are formed on the body of piezo-electric material as interleaved sets of comb-type electrodes by, for example, vapor-deposition techniques or the like. In the illustrated example, the input transducer 4 consists of an odd number of electrodes 6 which are connected in common (or short-circuited) to a reference potential, such as ground, and an even number of electrodes which may be considered as conductor pairs 7a, 7b and 7c connected in common to an input terminal 8 and interleaved with the electrodes 6. The output transducer 5 similarly consists of an odd number of electrodes 9 which are connected in common (or short-circuited) to a reference potential, such as ground, and an even number of electrodes which may be considered as conductor pairs 10a, 10b and 10c connected in common to an output terminal 11 and interleaved with the electrodes 9.

In general, the bandwidth of an acoustic surface-wave filter device is determined by the effective number of the conductors or conductor pairs included in the electrodes which constitute the transducer 4 or 5. The number of conductors can be changed by, for example, connecting one or more of the conductors 7, 10 to ground. In the example shown in FIG. 2B, the central pair of conductors 7b and 10b of the input and output transducers 4 and 5, respectively, are connected to ground so as to narrow the bandwidth of the filter device. However, it should be apparent that the bandwidth of the filter device can be narrowed by connecting one or more other conductors to ground, as well as by other techniques.

The desirability of having the capability of narrowing the bandwidth of a filter device is recognized by those of ordinary skill in the radio reception art. For example, the selectivity of an FM receiver can be improved by narrowing the bandwidth of the IF filter (as compared to the normal bandwidth) when adjacent broadcast stations are close in frequency separation. Conversely, if adjacent broadcast frequencies are farther apart, the bandwidth of the IF filter can be widened to improve the distortion characteristic of the receiver.

The radiation conductance $G_O$ of the illustrated acoustic surface-wave filter device is expressed as follows:

$$G_0 = \frac{4}{\pi} k^2 \omega_o C_T N^2 \quad (1)$$

where $C_T$ represents the capacity of the transducer which is in proportion to the number $N$ of the conductors comprising the transducer electrode, and $k$ is the piezo-electric coupling coefficient which depends upon the particular materials of which the piezo-electric body is formed.

Figure 2B:
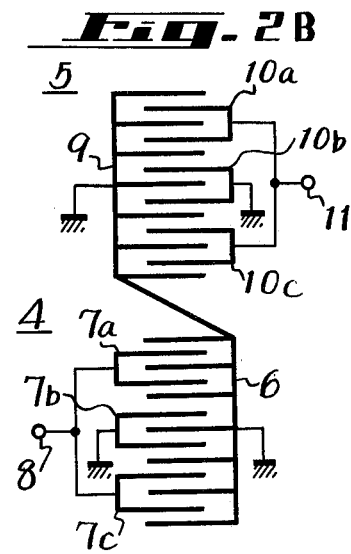

From equation (1), it will be apparent that when the number of electrode pairs is decreased, as in the case of FIG. 2B, N decreases so that the radiation conductance $G_O$ also is decreased. This causes the input and output impedances of the acoustic surface-wave filter device to increase.

In general, the input impedance $Z_{in}$ of the illustrated acoustic surface-wave filter device can be expressed as follows:

$$Z_{in} = \frac{1}{G_0 + j\omega_o C_T} \quad (2)$$

Since $G_O$ is proportional to $N^2$ as shown by equation (1), then if N is decreased, $G_O$ also is decreased and the input impedance $Z_{in}$ is increased.

Figure 3:
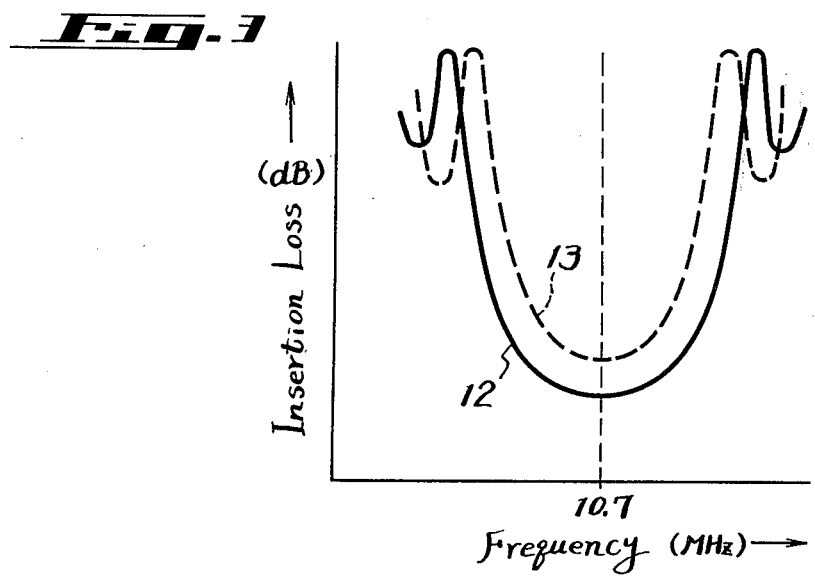
FIG. 3 is a graphical representation which is helpful in explaining the present invention.

A graphical representation of the change in the bandwidth of the filter device is shown in FIG. 3, wherein a solid line characteristic curve 12 represents the normal frequency selection characteristic of the filter device with a center frequency of 10.7 MHz when the conductor pattern is as shown in FIG. 2A, and a broken characteristic curve 13 represents the narrowed frequency selection characteristic of the filter device when the conductor pattern is as shown in FIG. 2B to narrow the bandwidth. As will be understood from this graphical representation, when the band width of the filter is narrowed, its insertion loss is increased. This is caused by the fact that when the number of conductor pairs is decreased, the conversion efficiency of the acoustic surface-wave filter device is lowered.

For the application of the acoustic surface-wave filter device as an IF filter in an FM receiver, the changes in the input and output impedances and insertion loss of the filter device caused by the change of the bandwidth thereof should be compensated. This compensation should be effected while a signal is supplied to the acoustic surface-wave filter device. It thus becomes necessary to match the impedance and insertion loss changes by varying the input and output impedance of the acoustic surface-wave filter device and by compensating for its change in gain. This matching, or compensation, is carried out by the apparatus illustrated in FIG. 4 in which the depicted embodiment is used as an IF amplifier of an FM receiver.

In the embodiment of FIG. 4, a first amplifier stage 21 is provided with an input terminal 27 adapted to be supplied with, for example, the output signal from a mixer circuit of an FM receiver (not shown). The amplifier stage 21 is connected to drive an acoustic surface-wave filter device whose construction and operating characteristics have been described hereinabove. The input terminal 8 of the device 31 is connected to the output terminal of the amplifier 21 and, as shown, the output terminal 11 of the device is connected to a succeeding amplifier stage 22. Additional acoustic surface-wave filter devices 32, 33, . . . , 36, each being driven by a corresponding amplifier 22, 23, . . . , 26, respectively, are connected in cascade, and the output terminal 11 of the last stage in the illustrated filter circuit is adapted to be coupled to an FM detector (not shown). In one embodiment, such as that depicted herein, some of the filter devices 31, 32 and 33 are adapted to have their bandwidths changed in the manner shown in FIGS. 2A and 2B, while the other filter devices 34, 35 and 36 exhibit fixed bandwidths. Switches $S_1$ to $S_6$, such as change-over switches, are connected to the acoustic surface-wave filter devices 31, 32 and 33, as shown, and are adapted to selectively change the filter bandwidths. For example, the filter device 31 has its input terminal 8 (shown in FIG. 2A) connected to a fixed contact $b$ of the switch $S_1$ and its conductor pair 7b connected to a movable contact $a$ of this switch. Another fixed contact $c$ is connected to ground. Similarly, the output terminal 11 of the filter device 31 (shown in FIG. 2A) is connected to a fixed contact $b$ of the switch $S_2$ while the conductor pair 10b is connected to a movable contact $a$ of this switch. Another fixed switch contact $c$ is connected to ground. With the contacts $a$ in engagement with the contacts $b$ of the switches $S_1$ and $S_2$, the filter device has the configuration shown in FIG. 2A. If the contacts *a* engage the contacts *c*, the filter device is changed to the configuration shown in FIG. 2B, thus narrowing its bandwidth. If desired, the switches $S_1$ to $S_6$ all can be operated independently of each other, or pairs of switches (e.g. $S_1$, $S_2$; $S_3$, $S_4$; $S_5$, $S_6$) can be ganged, or all of the switches can be operated simultaneously.

It is appreciated that all of the amplifiers 21 to 26 may have the same construction and all of the acoustic surface-wave filters 31 to 36 likewise may have the same construction. To simplify the following explanation, the combination of the first amplifier 21 and the first acoustic surface-wave filter device 31 will be described in connection with a change in the filter bandwidth. This description is equally applicable to the remaining amplifier-filter device combinations.

The amplifier 21 is formed as a differential amplifier having common-connected transistors 42 and 43 coupled to ground through a constant current source 41. The base electrode of the transistor 42 is connected to the input terminal 27 and the base electrode of the transistor 43 is AC coupled to ground. The collector electrodes of the transistors 42 and 43 are connected through resistors 44 and 45, respectively, to a voltage source terminal $+V_{CC}$. An amplifier output signal is derived from the collector electrode of the transistor 43, and this output signal is supplied to the input terminal 8 of the acoustic surface-wave filter device 31. The collector electrode of the transistor 42 is connected through a resistor 46 to the movable contact *a* of the switch $S_1$ and, as shown, the fixed switch contact *b* is connected to the collector electrode of the transistor 43. The other fixed switch contact *c* can be connected directly to ground, as shown, or, alternatively, may be coupled to ground through a by-pass capacitor.

It should be appreciated that the switch $S_1$ functions to selectively couple a conductor pair of the input transducer electrode of the acoustic surface-wave filter device 31 to ground if the movable contact *a* engages the contact *c*. This reduces the number of conductors in the filter device (see FIGS. 2A and 2B) to thus narrow its bandwidth. The switch $S_1$ also functions to change the load resistance of the amplifier 21 which, in turn, changes the gain and output impedance of the amplifier.

The output terminal 11 of the acoustic surface-wave filter device 31 is connected to the next stage of the filter circuit and, more particularly, to the input of amplifier 22. The signal derived at the output terminal 11 is applied across a resistor 47 which is provided for impedance matching between the acoustic surface-wave filter device 31 and the amplifier 22. The switch $S_2$ is connected to the acoustic surface-wave filter device 31 is aforesaid. In addition, the movable contact *a* of the switch $S_2$ is connected to ground through a resistor 48. Thus, it should be appreciated that the switch $S_2$ functions to selectively couple a conductor pair of the output transducer electrode of the acoustic surface-wave filter device 31 to ground if its movable contact *a* engages its fixed contact *c* (see FIGS. 2A and 2B) to thus narrow the bandwidth of the filter device. The switch $S_2$ also functions to change (e.g., increase) the matching impedance at the output of the filter device 31.

In the embodiment shown in FIG. 4, when the movable contacts *a* of the switches $S_1$ and $S_2$ engage their respective fixed contacts *b* as shown, the conductor pairs 7*b* and 10*b* of the acoustic surface-wave filter device 31 are connected to the input and output terminals 8 and 11, respectively. In this condition, the acoustic surface-wave filter device exhibits its normal bandwidth. When the movable contacts *a* of these switches engage their respective fixed contacts *c*, the conductor pairs 7*b* and 10*b* are connected to ground (FIG. 2B) and, hence, the bandwidth of the acoustic surface-wave filter device 31 is narrowed. In this latter condition, i.e., with narrow bandwidth, the input and output impedances of the filter device are greater than when the bandwidth thereof exhibits its normal value, and its insertion loss is increased, as described previously hereinabove.

If it is assumed that the resistances of the resistors 44, 45 and 46 are $R_4$, $R_5$ and $R_6$, respectively, then the gain G of the amplifier 21 when the movable contact *a* of the switch $S_1$ engages its fixed contact *b*, can be expressed by the following equation:

$$G = E_1 - E_2 \frac{R_5}{R_5 + R_6} \qquad (3)$$

where $E_1$ and $E_2$ are the voltages at the collector electrodes of the transistors 43 and 42, respectively.

In equation, (3), the voltage $E_1$ is a function of the resistance $R_5$ in parallel with series resistances $R_4$ and $R_6$, and the voltage $E_2$ is a function of the resistance $R_4$ in parallel with series resistances $R_5$ and $R_6$. This can be expressed as:

$$E_1 = K\{R_5 \,/\!/\, (R_4 + R_6)\} \qquad (4)$$

$$E_2 = K\{R_4 \,/\!/\, (R_5 + R_6)\} \qquad (5)$$

where K is a constant and the symbol " $/\!/$ " represents parallel resistances.

From equations (3), (4) and (5), the gain G of amplifier 21 can be rewritten as follows:

$$\begin{aligned} G &= K \frac{R_5(R_4 + R_6)}{R_5 + R_4 + R_6} - \frac{R_5}{R_5 + R_6} \cdot K \frac{R_4(R_5 + R_6)}{R_5 + R_4 + R_6} \\ &= K \cdot R_5 \frac{R_6}{R_5 + R_4 + R_6} \end{aligned} \qquad (6)$$

The output impedance $Z_o$ of the amplifier 21 can be expressed as follows:

$$Z_o = R_5 \,/\!/\, (R_4 + R_6) \qquad (7)$$

Now, if the movable contact *a* of the switch $S_1$ is changed to engage the fixed contact *c*, the gain G of the amplifier 21 can be expressed as follows:

$$G = K \cdot R_5 \qquad (8)$$

With the switch $S_1$ in this condition, the output impedance $Z_o$ of the amplifier 21 becomes:

$$Z_o = R_5 \qquad (9)$$

Therefore, when the switch $S_1$ is changed over to change the bandwidth of the acoustic surface-wave filter device 31 from a normal bandwidth to a narrow bandwidth, and thus increase its insertion loss, the gain G of the amplifier 21 simultaneously is increased, as is apparent from equations (6) and (8) and, accordingly, the increased insertion loss is compensated. Further, the output impedance $Z_o$ of the amplifier 21 increases, as apparent from equations (7) and (9), so that even though the input impedance of the acoustic surface-wave filter device 31 is increased, impedance matching still is maintained.

When the switch $S_2$ is changed over to narrow the bandwidth of the acoustic surface-wave filter device 31, the output impedance of the filter device is increased. However, since this operation of the switch $S_2$ interrupts the parallel connection of the resistor 48 and the resistor 47 to thus increase the impedance connected to the output of the filter device, impedance matching at the output of the acoustic surface-wave filter device 31 is not disturbed.

It should be appreciated that in the embodiment of FIG. 4, the respective switches $S_3$ and $S_5$ perform the same function as that of switch $S_1$, and the respective switches $S_4$ and $S_6$ perform the same function as that of switch $S_2$. Accordingly, in the interest of brevity, further description of these switches need not be provided.

As may be understood from the foregoing description, the filter circuit of this present invention finds ready application as the IF filter of an FM receiver, especially since its bandwidth can be changed. Changes in the input and output impedances and insertion loss of the acoustic surface-wave filter device which accompany changes in the bandwidth can be compensated for, so that there are no deleterious effects even if the bandwidth of the acoustic surface-wave filter device is changed while a signal is supplied thereto.

In addition, the very same switches which are used to change the bandwidths of the acoustic surface-wave filter devices also cause the gains and impedances of the amplifiers to change. Consequently, the number of switches which must be used for this purpose can be reduced. This offers the advantage of stable circuit operation and, if a number of stages are provided, the circuit exhibits a desirably simple construction.

While the present invention has been particularly shown and described with reference to a preferred embodiment, it will be readily apparent that various changes and modifications in form and details may be made by one of ordinary skill in the art without departing from the spirit and scope of the invention. It is intended that the appended claims be interpreted to include all such changes and modifications.

What is claimed is:

1. A filter circuit comprising: an acoustic surface-wave filter device having an input transducer comprised of a first set of interleaved electrodes formed of conductor elements and disposed on a first portion of a body of piezo-electric material adapted to propagate acoustic surface waves, an output transducer comprised of a second set of interleaved electrodes formed of conductor elements and disposed on a second portion of said body of piezo-electric material and spaced from said input transducer, an input terminal coupled to said input transducer to apply a signal thereto and an output terminal coupled to said output transducer from which a filtered output signal is derived; an amplifier coupled to said input terminal for supplying an input signal thereto; and means coupled to said acoustic surface-wave filter device and to said amplifier for changing the number of conductor elements in at least one of said sets of interleaved electrodes for selectively changing the bandwidth of said acoustic surface-wave filter device and for selectively changing the gain and the output impedance of said amplifier, whereby changes in the insertion loss and the input impedance of said acoustic surface-wave filter device which accompany changes in said filter characteristics thereof are compensated.

2. A filter circuit in accordance with claim 1 wherein said first set of electrodes is comprised of an even number of conductor elements connected in common to said input terminal and an odd number of interleaved conductor elements connected in common to a reference potential.

3. A filter circuit in accordance with claim 2 wherein said second set of electrodes is comprised of an even number of conductor elements connected in common to said output terminal and an odd number of interleaved conductor elements connected in common to said reference potential.

4. A filter circuit in accordance with claim 1, further comprising plural acoustic surface-wave filter devices coupled in cascade to said output terminal; a driving amplifier associated with each of said plural acoustic surface-wave filter devices to supply an input signal thereto and to receive a filtered signal from a preceding acoustic surface-wave filter device; and additional means coupled to at least some of said plural acoustic surface-wave filter devices and associated driving amplifiers for selectively changing the bandwidth of said at least some of said devices by changing the number of conductor electrodes in at least one of said sets of interleaved electrodes in said at least some of said devices and for selectively changing the gain and the output impedance of said associated driving amplifiers.

5. A filter circuit comprising: an acoustic surface-wave filter device having an input transducer comprised of a first set of interleaved electrodes formed of conductor elements and disposed on a first portion of a body of piezo-electric material adapted to propagate acoustic surface waves, an output transducer comprised of a second set of interleaved electrodes formed of conductor elements and disposed on a second portion of said body of piezo-electric material and spaced from said input transducer, an input terminal coupled to said input transducer to apply a signal thereto and an output terminal coupled to said output transducer from which a filtered output signal is derived; an amplifier coupled to said input terminal for supplying an input signal thereto and comprising a load impedance, the gain of said amplifier being dependent upon said load impedance; and switch means for selectively changing the number of interleaved conductor elements in at least one of said sets to change the filter characteristics of said acoustic surface-wave device and for selectively changing the gain of said amplifier, said switch means being coupled to at least one of the conductor elements in said input transducer and also to said load impedance for simultaneously removing electrically said at least one conductor element from its interleaved relationship and changing said load impedance thereby to change said gain, whereby changes in the insertion loss of said acoustic surface-wave filter device which accompany changes in said filter characteristics thereof are compensated.

6. A filter circuit in accordance with claim 5 wherein said switch means comprises a change-over switch having a first state in which said at least one conductor element is in said interleaved relationship and a second state in which said at least one conductor element is removed electrically from said interleaved relationship to thereby narrow the bandwidth of said acoustic surface-wave filter device and simultaneously to increase the gain of said amplifier.

7. A filter circuit in accordance with claim 6 wherein said means for changing the filter characteristics of said acoustic surface-wave filter device further comprises additional switch means coupled to at least one of the conductor elements in said output transducer for removing electrically said last-named one conductor element from its interleaved relationship in said output transducer.

8. A filter circuit in accordance with claim 7 wherein said additional switch means comprises a second change-over switch connected to output impedance means and having a first state in which said at least one conductor element is in said interleaved relationship in said output transducer and a second state in which said at least one conductor element is removed electrically from said interleaved relationship in said output transducer and simultaneously to increase the impedance of said output impedance means.

9. A filter circuit comprising: an acoustic surface-wave filter device having an input terminal receiving a signal, an output terminal, an input transducer comprised of a first set of interleaved electrodes disposed on a first portion of a body of piezo-electric material adapted to propagate acoustic surface waves, said first set of interleaved electrodes having an even number of conductor elements connected in common to said input terminal and an odd number of interleaved conductor elements connected in common to a reference potential, an output transducer comprised of a second set of interleaved electrodes disposed on a second portion of said body of piezo-electric material and spaced from said input transducer, said second set of electrodes having an odd number of interleaved conductor elements connected in common to said reference potential and an even number of conductor elements connected in common to said output terminal and providing a filtered output signal thereto: an amplifier coupled to said input terminal for supplying an input signal thereto; and switch means for selectively changing the filter characteristics of said acoustic surface-wave filter device and for selectively changing the gain of said amplifier, said switch means being coupled to said acoustic surface-wave filter device and to said amplifier for selectively connecting at least one of the even number of said conductor elements in said first and second sets to said reference potential thereby to reduce the bandwidth of said acoustic surface-wave filter device, whereby changes in the insertion loss of said acoustic surface-wave filter device which accompany changes in said filter characteristics thereof are compensated.

10. A filter circuit in accordance with claim 9 wherein said amplifier is comprised of differentially-connected stages each having outputs, a first output of one of said stages being connected to said input terminal; and wherein said switch means comprises a change-over switch having a first state for connecting said at least one of the even number of conductor elements in said first set to said input terminal and, concurrently, for interconnecting said first output of one of said stages with a second output of another of said stages through a resistor, and a second state for connecting said at least one of said even number of conductor elements in said first set to said reference potential and, concurrently, for coupling said second output to said reference potential.

11. A filter circuit in accordance with claim 10 wherein said means for selectively changing said filter characteristics further comprises means for changing the output impedance of said acoustic surface-wave filter device as the bandwidth of said device is changed.

12. A filter circuit in accordance with claim 11 wherein said means for changing said output impedance comprises a second resistor for connecting said output terminal to said reference potential and a third resistor; and a second change-over switch having a first state for connecting said at least one of the even number of conductor elements in said second set to said output terminal, and, concurrently, for connecting said second resistor in parallel with said third resistor, and a second state for connecting said at least one of said even number of conductor elements in said second set to said reference potential and, concurrently, for disconnecting said parallel connection.

13. A filter circuit in accordance with claim 12 wherein said first and second change-over switches are operable together.

14. A filter circuit comprising: an acoustic surface-wave filter device having an input transducer comprised of a first set of interleaved electrodes formed of conductor elements and disposed on a first portion of a body of piezo-electric material adapted to propagate acoustic surface-waves, an output transducer comprised of a second set of interleaved electrodes formed of conductor elements and disposed on a second portion of said body of piezo-electric material and spaced from said input transducer, an input terminal coupled to said input transducer to apply a signal thereto and an output terminal coupled to said output transducer from which a filtered output signal is derived; an amplifier coupled to said input terminal for supplying an input signal thereto and comprising a load impedance, the gain of said amplifier being dependent upon said load impedance; and switch means for reducing said number of interleaved conductor elements to thereby narrow the bandwidth of said acoustic surface-wave filter device and cause the impedance and insertion loss of said device to increase, said switch means being coupled to said acoustic surface-wave filter device and to said load impedance of said amplifier such that when said switch means is operated to narrow said bandwidth, said load impedance is changed to increase said gain and the output impedance of said amplifier whereby changes in the insertion loss of said acoustic surface-wave filter device which accompany changes in said filter characteristics thereof are compensated.

15. A filter circuit in accordance with claim 14 wherein said amplifier is a differential amplifier comprised of differentially-connected stages each having an output; and said switch means comprises a switch having a movable contact coupled to at least one of the conductor elements in said first set and to the output of one of said stages, a first fixed contact coupled to said input terminal and to the output of the other of said stages, and a second fixed contact coupled to a reference potential.

16. A filter circuit comprising: an acoustic surface-wave filter device having an input transducer comprised of a first set of interleaved conductor elements disposed on a first portion of a body of piezo-electric material adapted to propagate acoustic surface waves, an output transducer comprised of a second set of interleaved conductor elements disposed on a second portion of said body of piezo-electric material and spaced from said input transducer, an input terminal coupled to said input transducer to apply a signal thereto, and an output terminal coupled to said output transducer from which a filtered output signal is derived; an amplifier having changeable load impedance to thereby change the gain and output impedance thereof coupled to said input terminal for supplying an input signal thereto; a first switch connected to at least one of the conductor elements of said first set to electrically remove said at least one conductor element from its interleaved relationship to cause the bandwidth of said acoustic surface-wave filter device to increase, said first switch being further connected to said load impedance of said amplifier to change said load impedance concurrently with the change in said bandwidth so as to increase the gain and output impedance and compensate for an increased insertion loss and impedance of said acoustic surface-wave filter device; changeable output impedance connected to said output terminal; and a second switch connected to at least one of the conductor elements of said second set to electrically remove said at least one conductor element of said second set from its interleaved relationship; said second switch being further connected to said output impedance to increase said output impedance so as to compensate for an increased impedance of said acoustic surface-wave filter device when its bandwidth is changed.

17. A filter circuit in accordance with claim 16 wherein said first and second switches are operable simultaneously.

18. A filter circuit in accordance with claim 16 wherein each of said first and second sets of conductor elements is comprised of an even number of conductor elements interleaved with and electrically separated from an odd number of conductor elements; and each of said first and second switches is connected to a pair of conductor elements included in an even number thereof.

* * * * *